United States Patent [19]

Pavin

[11] Patent Number: 4,484,154

[45] Date of Patent: Nov. 20, 1984

[54] FREQUENCY CONTROL WITH A PHASE-LOCKED-LOOP

[75] Inventor: Randall B. Pavin, Fullerton, Calif.

[73] Assignee: Rockwell International Corporation, El Segundo, Calif.

[21] Appl. No.: 299,453

[22] Filed: Sep. 4, 1981

[51] Int. Cl.³ .......................... H03L 7/06; G01S 13/82
[52] U.S. Cl. ......................................... 331/23; 331/25; 331/18; 329/50; 329/122; 328/155; 455/75; 455/605; 455/606; 343/5 AF; 343/7 PL; 343/7.6; 307/262; 367/95
[58] Field of Search ................ 331/18, 23, 25; 329/50, 329/122, 124; 328/155; 455/62, 69, 71, 75, 119, 126, 259, 260, 265, 600, 605, 606, 106; 343/5 AF, 5 BB, 6.5 R, 7 PL, 7.6, 18 D, 5 SA, 6.5 SS; 367/95, 96, 97, 98; 307/70, 106, 142, 144, 262; 375/74

[56] References Cited

U.S. PATENT DOCUMENTS

| | | | |
|---|---|---|---|
| 3,597,754 | 8/1971 | Lerner | 367/95 |
| 3,649,123 | 3/1972 | Ulicki | 343/7 PL X |
| 4,019,138 | 4/1977 | Watanabe et al. | 455/69 X |
| 4,032,858 | 6/1977 | Hargis | 328/155 X |
| 4,107,684 | 8/1978 | Watson, Jr. | 367/95 X |
| 4,122,427 | 10/1978 | Karsh | 367/95 X |
| 4,155,087 | 5/1979 | Okrent | 343/7.6 |
| 4,225,950 | 9/1980 | Kotera et al. | 367/96 X |
| 4,271,371 | 6/1981 | Furuichi et al. | 331/25 X |
| 4,327,362 | 4/1982 | Hoss | 250/231 SE |

OTHER PUBLICATIONS

Best, R., "Theory and Applications of Phase Locked Loops," part 6, Der Elektroniker, v. 15 n. 7 pp. EL26-- EL32, Jul. 1976.

Primary Examiner—Stanley D. Miller
Assistant Examiner—W. R. Paxman
Attorney, Agent, or Firm—H. Fredrick Hamann; S. Alfred Uchizono

[57] ABSTRACT

A frequency control system with a phase-locked loop for automatically adjusting the frequency of an alternating signal and an external signal derived coherently therefrom to the variant zero phase-shift frequency of a phase shifter adapted to receive the external signal, the control system comprising: a phase shifter responsive to the external signal for introducing a frequency sensitive bipolar phase-shift to the external signal to produce a phase shifted external signal thereat, the phase shifter introducing zero phase-shift at a drift-prone frequency, $f_o$; an alternating signal source for generating the alternating signal of adjustable frequency covering a range of frequencies including frequency, $f_o$, and variations thereof; a phase detector responsive to both the alternating signal and phase-shifted external signal for producing a phase-difference signal corresponding to the difference in phase between the alternating signal and phase-shifted external signal; and a signal integrator responsive to the phase-difference signal for converting the phase-difference signal to a frequency control signal; the alternating signal source being responsive to the frequency control signal in a phase-difference minimizing relation whereby the alternating signal frequency is adjusted to be substantially equal to frequency, $f_o$.

8 Claims, 2 Drawing Figures

FREQUENCY CONTROL WITH A PHASE-LOCKED-LOOP

The invention described herein was made in the course of or under a contract or subcontract thereunder, with the United States Air Force.

BACKGROUND OF THE INVENTION

This invention has to do with automatic frequency control systems. More particularly, it concerns systems and methods for adjusting the frequency of an alternating signal using a phase-lock-loop wherein the frequency is adjusted to track a frequency corresponding to a particular characteristic of an input signal device.

To achieve good noise rejection in circuit applications, as for example in the input to communication receivers, it is desirable to match the bandwidth limiting characteristics of the input device to the spectral characteristics of the input signal. Where a frequency misalignment of one characteristic relative to the other occurs, either because of circuit drift, signal shift, or design tolerance, typically, either signal power is lost or signal distortion is introduced. Therefore, it is desirable to be able to adjust one spectral characteristic relative to the other and bring them into alignment.

For an initial misalignment resulting from design tolerances, alignment is possible by manually trimming either the spectral characteristics of the input signal or the passband characteristics of the input device. Manual adjustments may also be used to overcome long term drift arising, for example, from component aging, where intervals between adjustment are acceptable. However, where the rate of drift or frequency shift is substantial relative to the criticality of spectral alignment, automatic methods of frequency alignment or synchronization must be employed.

The literature is replete with descriptions of systems and methods for automatic frequency control. In particular, those concepts which are categorized under the popular term "phase-lock-loop" with which the present invention is closely related, are representively described in the following book publications. They are: *Phaselock Techniques* by Floyd M. Gardner, Second Edition, John Wiley and Sons, 1979; *Principles of Coherent Communication* by Andrew J. Viterbi, McGraw-Hill, Inc., 1966; *Synchronization Systems in Communication and Control* by William C. Lindsey, Prentice-Hall, Inc., 1972; and *Phase-Locked Loops and Their Application,* edited by William C. Lindsey and Marvin K. Simon, IEEE Press, 1978.

Despite the abundance of concepts described in the aforementioned publications, there appears to be an absence of a concept or system for automatically adjusting the frequency of an alternating signal, such as an oscillator output, to minimize the spectral misalignment between the input signal spectrum, which in some manner is coherently derived from the alternating signal, and the band-limiting characteristics of the input device, wherein the spectral misalignment results from either design tolerances or the frequency drift in the band-limiting input device.

SUMMARY OF THE INVENTION

It is accordingly a major object of the present invention to provide a control system for automatically aligning an input signal spectrum to the band-limiting spectral characteristics of an input device where, because of design tolerance or drift characteristics of the input device, misalignments would otherwise occur.

It is a further object of the present invention to provide a frequency control system for automatically adjusting the frequency of an alternating signal to correct for any misalignment which may exist between a signal derived coherently from that alternating signal and a defined frequency characteristic of an input device to the control system.

It is a still further object of the present invention to provide a frequency control system for adjusting the frequency of an alternating signal and an external signal derived coherently therefrom to the zero phase-shift frequency of phase-shift means adapted to receive the external signal, where the zero phase-shift frequency is drift-prone with time.

A still further object of the present invention is to provide a frequency control system for adjusting the frequency of an alternating signal and an external signal derived therefrom to a defined frequency characteristic of an input device to the control system and means for biasing out transit time delays of the external signal.

It is a still further object of the present invention to provide in combination with a phase-lock-loop having a voltage controlled oscillator, an apparatus to adjust the frequency of the oscillator to a drift-prone frequency, $f_o$, corresponding to zero phase-shift through an input phase-shift device.

A still further object of the present invention is to provide a method for automatically adjusting the frequency of an alternating signal and an external signal derived coherently therefrom to the drift-prone frequency corresponding to zero phase-shift through a phase-shifter adapted to receive the external signal.

It is a still further object of the present invention to provide a method for adjusting the frequency of an alternating signal and an external signal, derived coherently therefrom and determinably time-delayed relative thereto, to a defined frequency characteristic of a frequency control system input device.

These and other objects of the invention are achieved in accordance with the teachings herein in an improved frequency control system for automatically adjusting the frequency of an alternating signal and an external signal derived coherently therefrom to the drift-prone zero-phase-shift frequency of phase-shift means adapted to receive the external signal, the control system comprising: phase-shift means responsive to the external signal for introducing a frequency sensitive bipolar phase-shift to the external signal to produce a phase-shifted external signal, the phase-shift means introducing zero phase-shift at drift-prone frequency, $f_o$; an alternating signal source for generating the alternating signal of adjustable frequency covering a range of frequencies including frequency, $f_o$, and variations thereof; means responsive to both the alternating signal and the phase-shifted external signal for producing a phase-difference signal corresponding to the difference in phase between the alternating signal and the phase-shifted external signal; and means responsive to the phase-difference signal for converting the phase-difference signal to a frequency control signal; the alternating signal source responsive to the frequency control signal to minimize the difference in phase between said alternating signal and said phase-shifted external signal whereby the alternating signal frequency is adjusted to be substantially equal to frequency, $f_o$.

In particular embodiments of the above-described frequency control system the alternating signal source comprises a voltage controlled oscillator. In other embodiments, the means for producing the phase-difference signal comprises a phase-detector, and in other embodiments, comprises means for biasing out transit time delays of the external signal. In still other embodiments the means for converting the phase-difference signal comprises a signal integrator. In still further embodiments, the frequency control system further comprises means for remotely impressing amplitude variations upon the external signal. In still further embodiments of the above-described frequency control system, the system further comprises means responsive to the phase-shifted external signal for demodulating amplitude variations carried by the external signal.

In other particular embodiments of the above-described frequency control system, the phase-shift means comprises a bandpass filter having a passband covering a range of frequencies including frequency, $f_o$, and the variations thereof.

In still another embodiment of the present invention, there is contemplated a method for adjusting the frequency of an alternating signal and an external signal, derived coherently therefrom and determinably time-delayed relative thereto, to the drift-prone frequency corresponding to zero phase-shift through a phase-shifter adapted to receive the external signal, the method comprising the steps of: biasing out the phase-shifting effects of the determinable time-delay in the external signal; shifting the phase of the external signal in accordance with the magnitude of its frequency deviation from the drift-prone zero phase-shift frequency, $f_o$, of the phase-shifter; generating the alternating signal of adjustable frequency covering a range of frequencies including frequency, $f_o$, and variations thereof; producing a phase-difference signal corresponding to a difference in phase between the alternating signal and phase-shifted external signal; converting the phase-difference signal to a frequency control signal; and causing the signal source means to respond to the frequency control signal in the phase-difference minimizing relation whereby the alternating signal frequency is adjusted to be substantially equal to the drift-prone frequency, $f_o$.

BRIEF DESCRIPTION OF DRAWINGS

The invention will be further described as to an illustrative embodiment in conjunction with the attached drawings in which.

DESCRIPTION OF PREFERRED EMBODIMENTS

Figure 1:
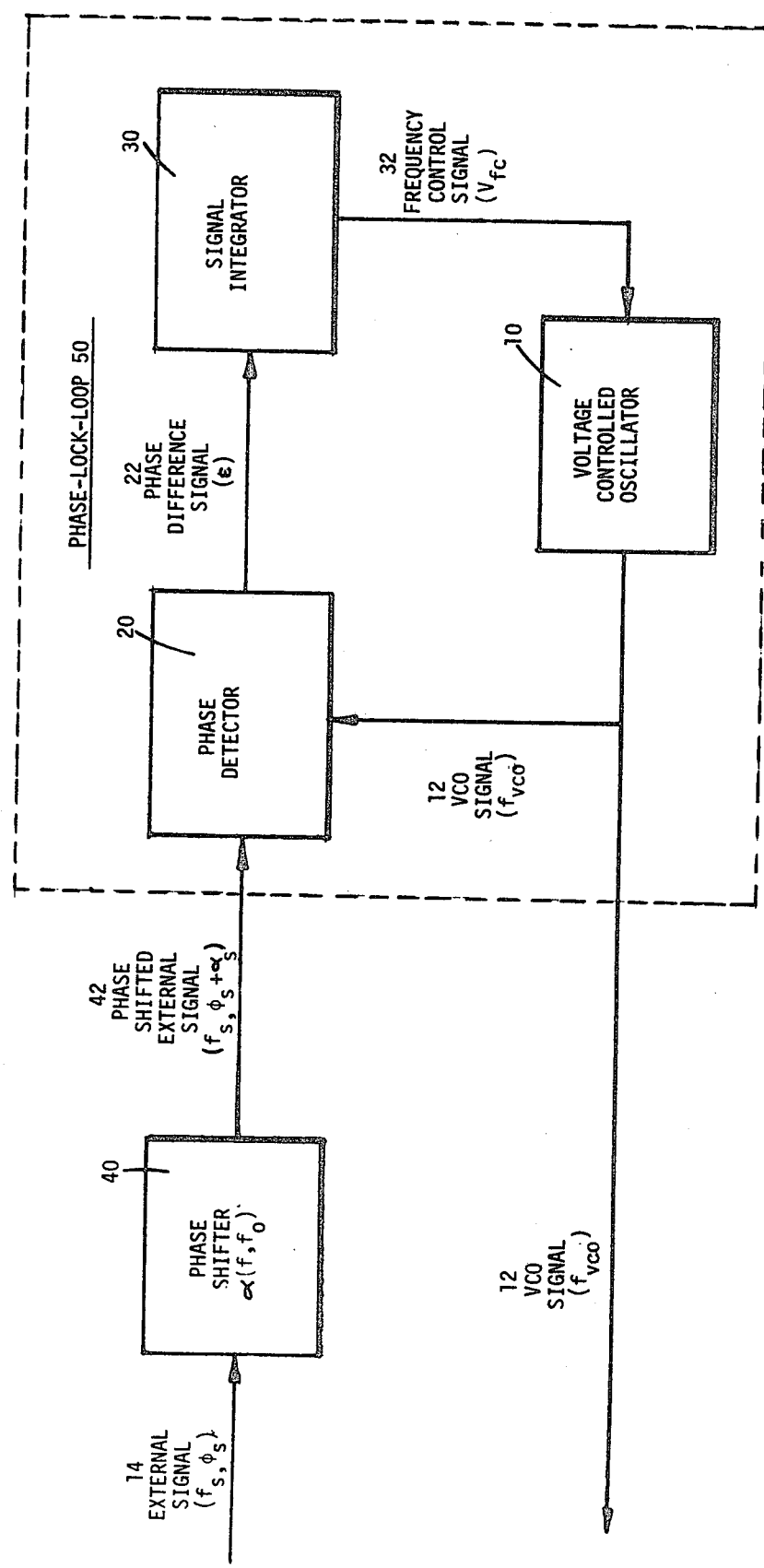
FIG. 1 is a diagram of a frequency control system in accordance with the present invention.

Turning now to the drawings, there is shown in FIG. 1, a block diagram of a feedback control system for controlling the frequency, $f_{vco}$, of the alternating signal, VCO signal 12, in accordance with a preferred embodiment of the present invention. The voltage-controlled oscillator (VCO) 10, the phase detector 20 and the signal integrator 30 together constitute the main elements of the phase-lock-loop 50 used to control the VCO frequency, $f_{vco}$. The phase-lock-loop 50 is shown within the broken line enclosure. For a description of the types of voltage-controlled oscillators, phase detectors and signal integrators applicable to phase-lock-loop applications, reference is made to chapter 6 entitled "Loop Components" of the aforementioned book publication *Phaselock Techniques* by Gardner, or any other of many available publications which describe these components and their characteristics in detail.

With reference to the phase detector 20, where a multiplier type is used, typically, in order to produce an output signal which is proportional to the sine rather than the cosine of the difference in phase between the two signals whose phase is being compared, the signals must be in quadrature with respect to each other. Therefore, implicit in the function of the phase detector 20 is the 90 degree phase shift of one input signal relative to the other input. Further, where the application so dictates, additional phase shifts between the two inputs are necessary where the external signal 14 has undergone a propagation transit-time delay of significant duration relative to the period of the VCO signal 12. For example, where $f_{vco}$ is a 1 megahertz signal, and the transit time delay is on the order of a microsecond, the transit time delay is significant and some means to compensate for this transit time delay is required. If the application calls for a cyclical VCO signal 12, then, a means to bias out this transit time delay is achieved by a phase-shifter capable of up to 360 degrees of phase shift adjustment.

Elsewhere herein the voltage controlled oscillator 10 is referred to as an alternating signal source for generating alternating signals of adjustable frequency, the phase-detector 20 is referred to as means responsive to the alternating signal and the phase-shifted external signal for producing a phase-difference signal corresponding to the difference in phase between the alternating signal and the phase-shifted external signal, and the signal integrator 30, is referred to as means responsive to the phase-difference signal for converting the phase-difference signal to a frequency control signal.

Also shown in FIG. 1 is the phase-shifter 40, which is seen to lie outside the phase-lock-loop 50. The phase shifter 40 is characterized by its capacity to introduce to signals applied at its input, a frequency sensitive phase shift, $\alpha$ (f,$f_o$), at its output, where f is the input signal frequency and $f_o$ is the frequency for which $\alpha$ (f,$f_o$) is equal to zero. This frequency, $f_o$, is typically subject to some variation resulting from temperature, aging, or other effects. Among the types of phase shifters contemplated by the present invention are all-pass filters, such as are described at page 159 in the book publication "Manual of Active Filter Design" by John L. Hilburn and David E. Johnson, McGraw-Hill Book Company, 1973, and bandpass filters. Characteristic of these types of filter devices which is pertinent to the present invention is the capacity to introduce frequency sensitive bipolar phase-shifts, i.e., both positive and negative phase shifts relative to the input as a continuous function of frequency, including zero phase-shift at frequency, $f_o$. Elsewhere herein, the phase-shifter is also referred to as phase-shift means responsive to an external signal for introducing a frequency sensitive bipolar phase-shift to the external signal.

When in lock, the phase-lock-loop 50 operates to adjust the frequency, $f_{vco}$, to be very close to the frequency, $f_s$, of the phase-shifted external signal 42. This adjustment in conjunction with the characteristics of the phase shifter 40, enable the frequency control system shown in FIG. 1 to adjust the frequency, $f_{vco}$, to be substantially equal to the drift-prone or variant zero phase-shift frequency, $f_o$, of the phase shifter 40.

The basic operation of this frequency control system is as follows: An external signal 14 having an average frequency, $f_s$, and an associated phase angle, $\phi_s$, is presented to the input of the frequency control system. The signal 14 traverses the phase-shifter 40 and undergoes a phase-shift relative to the input of an amount, $\alpha_s$. The magnitude and polarity of this relative phase-shift is dependent upon the deviation of frequency, $f_s$, from the zero phase-shift frequency, $f_o$, of the phase-shifter 40. The output from the phase-shifter 40 is indicated as the phase-shifted external signal 42 with its associated parameters, ($f_s$, $\phi_s+\alpha_s$). The phase-shifted external signal 42 is then applied to the phase-detector 20 which compares its phase against the phase of the VCO signal 12 (appropriately phase-biased for transit time delay), also applied to the phase detector, to produce the phase-difference signal 22 represented by the symbol $\epsilon$. The phase-difference signal 22 is then applied to the signal integrator 30 where it is integrated and processed to produce the frequency control signal 32 (represented by the symbol $V_{fc}$), which in turn is applied to the VCO 10. In response to the frequency control signal 32, the VCO produces the VCO signal 12 at frequency $f_{vco}$. The VCO signal 12 is applied to the phase-detector 20 as the reference signal against which the phase-shifted external signal 42 is compared in phase. In addition, the VCO signal 12 is provided also to serve as a reference signal from which the external signal 14 is coherently derived. Any difference in frequency between the external signal frequency, $f_s$, and the zero phase-shift frequency, $f_o$, of the phase-shifter 40 results in a frequency dependent phase-shift, $\alpha_s$ where $\alpha_s=$ for $f_s=f_o$. The introduction of the relative phase-shift, $\alpha_s$, to the external signal 14 results in the phase-shifted external signal 42, which in turn is applied to the phase detector 20 resulting in the phase-difference signal 22. The phase-difference signal 22 is applied to the signal integrator 30 to produce the frequency control signal 32, symbolized by $V_{fc}$, which in turn is applied to the VCO 10 to control its frequency, $f_{vco}$. As a result, $f_{vco}$ is dynamically adjusted until the external signal 14 derived coherently from it experiences zero relative phase-shift in passing through the phase-shifter 40, i.e., until $f_s=f_o$. This results in the sought after result of signal frequency alignment with the spectral characteristics of the input device, phase-shifter 40.

Ideally, in the absence of doppler frequency shift, VCO phase noise effects and other external dynamic perturbations on the signal, the average frequency, $f_s$, of the coherently derived external signal 14 is equal to the VCO frequency, $f_{vco}$, during in-lock conditions. In actual application, these disturbance factors are present, and some deviation from the ideal alignment will exist.

Figure 2:
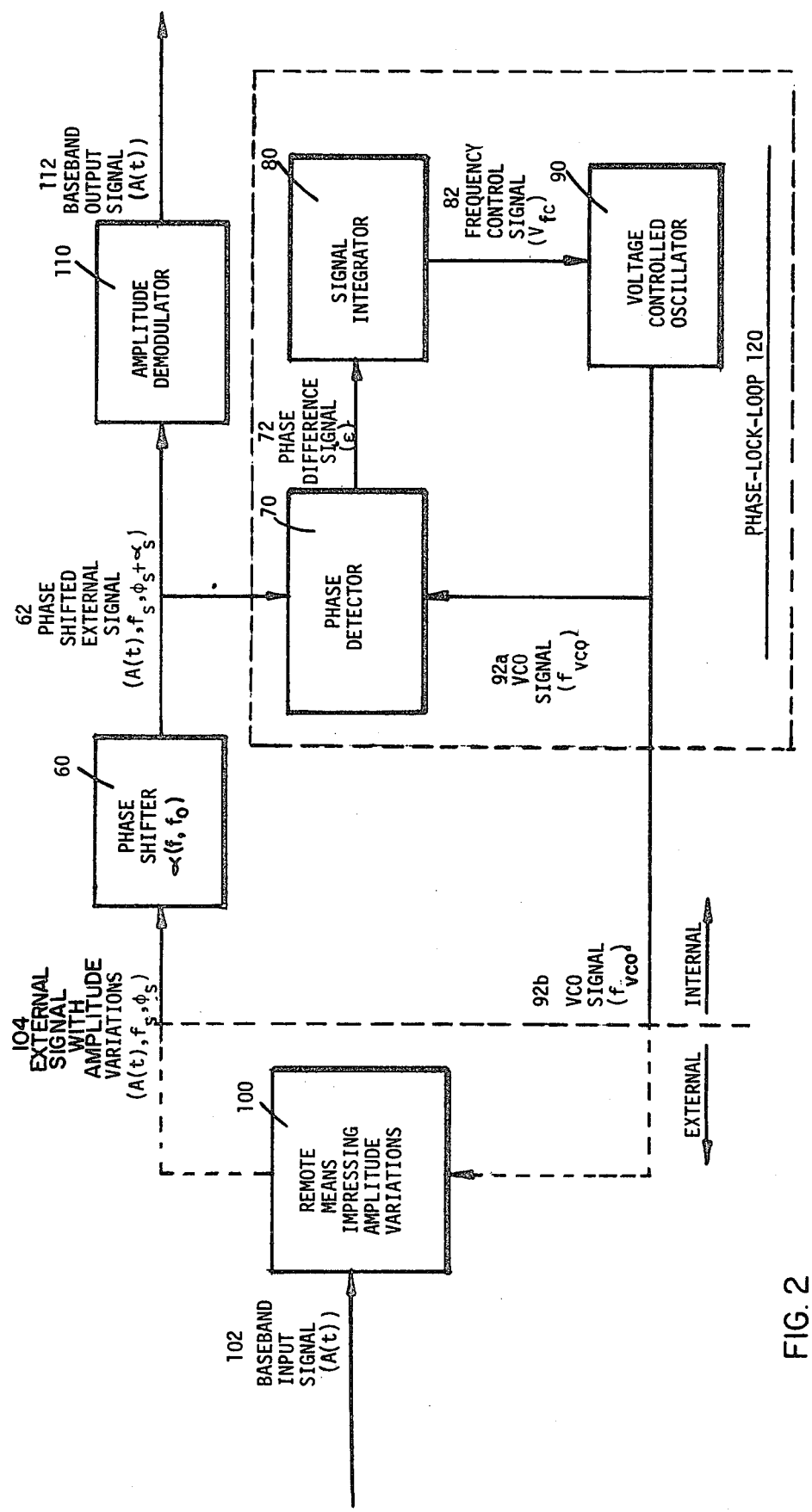
FIG. 2 is a block diagram of a frequency control system similar to that shown in FIG. 1 including external remote means for impressing amplitude variations on a signal derived from an oscillator signal and the return of that signal to the frequency control system for amplitude demodulation.

Referring now to FIG. 2, there is shown a frequency control system, much as in the system shown in FIG. 1, wherein there is shown a phase-lock-loop 120, with a phase-detector 70, signal integrator 80 and voltage controlled oscillator (VCO) 90, wherein the frequency, $f_{vco}$, of the VCO signal 92a is controlled to minimize the average phase-difference between the phase-shifted external signal 62 and the VCO signal 92a. As in the operation of the frequency control system of FIG. 1, when the loop 120 is in-lock, the three frequencies $f_o$, $f_s$, and $f_{vco}$ are subsatntially equal to each other absent significant external dynamic perturbations on the frequency $f_s$. Spectral alignment between the incoming signal 104 and the phase-shifter 60, provides the basis for optimized and tailored filtering against noise sources, which can be advantageous, for example, in an amplitude modulated communication system. Shown in FIG. 2 is the VCO signal 92b which is provided to an external and remotely located means 100 for impressing amplitude variations on the signal. The VCO signal 92b so provided to the remote means 100 is thereat amplitide modulated by the baseband input signal 102. The amplitude of the baseband input signal is represented by the symbol A(t). The signal 104 then leaving the remote means impressing amplitude variations 100 is returned to the frequency control system as the amplitude modulated external signal with amplitude variations 104 symbolized by the parameters (A(t), $f_s$, $\phi_s$). This external signal 104 undergoes a phase-shift, $\alpha_s$, corresponding to the deviation of the frequency, $f_s$, from the zero phase-shift frequency, $f_o$, of the phase-shifter 60. This phase shifted external signal 62 is then made available to the phase detector 70 where it is compared with the reference signal (the VCO signal 92a), whereupon it produces the phase-difference signal 72 represented by symbol, $\epsilon$. The phase-difference signal 72 is then fed to the signal integrator 80 where the signal is integrated and processed to produce the frequency control signal 82, which in turn controls the frequency of the VCO 90 to produce the VCO signals 92a and 92b, both at the same frequency, $f_{vco}$, and substantially equal to the frequency, $f_s$.

The phase-shifted external signal 62 is also provided to the input of an amplitude demodulator 110 whereupon the baseband signal 112 with an amplitude symbolized by A(t) is recovered, it being assumed no attenuation or distortion has occurred. Here then, the overall system operates to recover the baseband input signal 102 of amplitude A(t) at the amplitude demodulator 110 to produce the baseband output signal 112 of amplitude A(t). The remote means 100 for impressing amplitude variations on the VCO signal 92b or a signal derived coherently therefrom, in some embodiments may be a retroreflecting scheme wherein phase coherence is maintained and amplitude modulation driven by the baseband input signal is impressed upon the derived signal, to produce the signal which is ultimately returned as the external signal with amplitude variations 104.

Thus, the foregoing objects, including the major object of providing a control system for automatically aligning an input signal spectrum to the band-limiting spectral characteristics of an input device where, because of design tolerances or drift characteristics of the input device, misalignments would otherwise occur, are achieved by these embodiments of the invention through the novel approach of employing a frequency sensitive bipolar phase-shift input device with a phase-lock-loop.

Although the invention has been described and illustrated in detail, it is to be clearly understood that the same is by way of illustration and example only, and is not to be taken by way of limitation; the spirit and scope of the invention being limited only by the terms of the appended claims, wherein:

What is claimed is:

1. A frequency control system for automatically adjusting the frequency of an alternating signal and an external signal derived coherently therefrom to the drift-prone zero phase-shift frequency of phase-shift means adapted to receive said external signal, said control system comprising:

phase-shift means responsive to said external signal for introducing a frequency sensitive bipolar phase-shift to said external signal to produce a phase-shifted external signal, said phase-shift means introducing zero phase-shift at drift-prone frequency, $f_o$;

an alternating signal source for generating said alternating signal of adjustable frequency covering a range of frequencies including frequency, $f_o$, and variations thereof;

means responsive to both said alternating signal and said phase-shifted external signal for producing a phase-difference signal corresponding to the difference in phase between said alternating signal and said phase-shifted external signal which comprises means for biasing out the phase-shift due to transit time delays of said external signal; and means responsive to said phase-difference signal for converting said phase-difference signal to a frequency control signal;

said alternating signal source being responsive to said frequency control signal to minimize the difference in phase between said alternating signal and said phase-shifted external signal whereby said alternating signal frequency is adjusted to be substantially equal to frequency, $f_o$.

2. A frequency control system for automatically adjusting the frequency of an alternating signal and an external signal derived coherently therefrom to the drift-prone zero phase-shift frequency of phase-shift means adapted to receive said external signal, said control system comprising:

phase-shift means responsive to said external signal for introducing a frequency sensitive bipolar phase-shift to said external signal to produce a phase-shifted external signal, said phase-shift means introducing zero phase-shift at drift-prone frequency, $f_o$;

an alternating signal source for generating said alternating signal of adjustable frequency covering a range of frequencies including frequency, $f_o$, and variations thereof;

means responsive to both said alternating signal and said phase-shifted external signal for producing a phase-difference signal corresponding to the difference in phase between said alternating signal and said phase-shifted external signal;

means responsive to said phase-difference signal for converting said phase-difference signal to a frequency control signal; and means responsive to said phase-shifted external signal for demodulating amplitude variations carried by said external signal;

said alternating signal source being responsive to said frequency control signal to minimize the difference in phase between said alternating signal and said phase-shifted external signal whereby said alternating signal frequency is adjusted to be substantially equal to frequency, $f_o$.

3. A frequency control system for automatically adjusting the frequency of an alternating signal and an external signal derived coherently therefrom to the drift-prone zero phase-shift frequency of phase-shift means adapted to receive said external signal, said control system comprising:

phase-shift means responsive to said external signal for introducing a frequency sensitive bipolar phase-shift to said external signal to produce a phase-shifted external signal comprising a bandpass filter having a passband covering a range of frequencies including frequency, $f_o$, and variations thereof, said phase-shift means introducing zero phase-shift at drift-prone frequency, $f_o$;

an alternating signal source, comprising a voltage controlled oscillator, for generating said alternating signal of adjustable frequency covering a range of frequencies including frequency, $f_o$, and variations thereof;

means responsive to both said alternating signal and said phase-shifted external signal for producing a phase-difference signal corresponding to the difference in phase between said alternating signal and said phase-shifted external signal comprising a phase detector having means for biasing out the phase-shift due to transit time delays of said external signal; and means responsive to said phase-difference signal for converting said phase-difference signal to a frequency control signal;

said alternating signal source being responsive to said frequency control signal to minimize the difference in phase between said alternating signal and said phase-shifted external signal whereby said alternating signal frequency is adjusted to be substantially equal to frequency, $f_o$.

4. The frequency control system according to claim 3, in which said means for converting said phase-difference signal comprises a signal integrator.

5. The frequency control system according to claim 4, further comprising means for remotely impressing amplitude variations upon said external signal.

6. The frequency control system according to claim 5, further comprising means responsive to said phase-shifted external signal for demodulating amplitude variations carried by said external signal.

7. A feedback frequency control system for adjusting the frequency of an alternating signal and an external signal, derived coherently therefrom and determinably time-delayed relative thereto, to the drift-prone zero phase-shift frequency of phase-shift means adapted to receive said external signal, said control system comprising:

phase-shift means responsive to said external signal for introducing a frequency sensitive bipolar phase-shift to said external signal to produce a phase-shifted external signal, said phase-shift means introducing zero phase-shift at drift-prone frequency, $f_o$;

further phase-shift means responsive to said alternating signal for biasing out phase-shifts resulting from determinable propagation transit time delay of said external signal to produce a phase-biased alternating signal;

an alternating signal source for generating said alternating signal of adjustable frequency covering a range of frequencies including frequency, $f_o$, and variations thereof;

means responsive to both said phase-biased alternating signal and said phase-shifted external signal for producing a phase-difference signal corresponding to the difference in phase between said phase-biased alternating signal and said phase-shifted external signal; and means responsive to said phase-difference signal for converting said phase-difference signal to a frequency control signal;

said further phase-shift means adjusted to bias out the phase-shift due to said determinable propagation transit time delay of said external signal; and said alternating signal source being responsive to said frequency control signal to minimize the difference in phase between said phase-biased alternating signal and said phase-shifted external signal whereby said alternating signal frequency is adjusted to be substantially equal to frequency, $f_o$.

8. Method for adjusting the frequency of an alternating signal and an external signal, derived coherently therefrom and determinably propagation transit time-delayed relative thereto, to the drift-prone frequency, $f_o$, corresponding to zero phase-shift through a phase-shifter adapted to receive said external signal, said method comprising the steps of:

biasing out the phase-shifting effects of the determinable propagation transit time-delay of said external signal;

shifting the phase of said external signal in accordance with the deviation in frequency from said drift-prone frequency, $f_o$, of said phase-shifter to produce a phase-shifted external signal;

generating said alternating signal of adjustable frequency covering a range of frequencies including frequency, $f_o$, and variations thereof;

producing a phase-difference signal corresponding to a difference in phase between said alternating signal and said phase-shifted external signal;

converting said phase-difference signal to a frequency control signal; and causing said alternating signal to respond to said frequency control signal to minimize said difference in phase between said alternating signal and said phase-shifted external signal whereby said alternating signal frequency is adjusted to be substantially equal to said drift-prone frequency, $f_o$.

* * * * *

UNITED STATES PATENT AND TRADEMARK OFFICE
CERTIFICATE OF CORRECTION

PATENT NO. : 4,484,154
DATED : November 20, 1984
INVENTOR(S) : Randall B. Pavin

It is certified that error appears in the above-identified patent and that said Letters Patent are hereby corrected as shown below:

Column 2, line 47, please delete "-" after zero.

Column 5, line 36, please add --0-- after "=" and before "for".

Signed and Sealed this

Thirtieth Day of April 1985

[SEAL]

Attest:

DONALD J. QUIGG

Attesting Officer      Acting Commissioner of Patents and Trademarks